US006911874B2

(12) United States Patent
Dvorak

(10) Patent No.: US 6,911,874 B2
(45) Date of Patent: Jun. 28, 2005

(54) ULTRA-WIDEBAND IMPULSE GENERATION AND MODULATION CIRCUIT

(75) Inventor: Mark Daniel Dvorak, Waseca, MN (US)

(73) Assignee: Honeywell International Inc., Morristown, NJ (US)

( * ) Notice: Subject to any disclaimer, the term of this patent is extended or adjusted under 35 U.S.C. 154(b) by 70 days.

(21) Appl. No.: 10/067,025

(22) Filed: Feb. 4, 2002

(65) Prior Publication Data

US 2003/0146800 A1 Aug. 7, 2003

(51) Int. Cl.$^7$ .................................................. H03K 7/04
(52) U.S. Cl. ...................................... 332/112; 375/239
(58) Field of Search ............................. 332/112, 108, 332/109, 106; 375/239

(56) References Cited

U.S. PATENT DOCUMENTS

| | | | | |
|---|---|---|---|---|
| 5,499,392 A | * | 3/1996 | Grunwell | 455/260 |
| 5,512,834 A | * | 4/1996 | McEwan | 324/642 |
| 5,523,760 A | | 6/1996 | McEwan | 342/89 |
| 5,541,605 A | | 7/1996 | Heger | 342/85 |
| 5,543,799 A | | 8/1996 | Heger | 342/85 |
| 5,764,162 A | | 6/1998 | Ehrlich | 340/933 |
| 5,804,921 A | | 9/1998 | McEwan et al. | 315/20 |
| 5,805,110 A | | 9/1998 | McEwan | 342/387 |
| 5,854,603 A | | 12/1998 | Heger | 342/85 |
| 5,896,102 A | | 4/1999 | Heger | 342/85 |
| 5,995,534 A | * | 11/1999 | Fullerton et al. | 375/146 |
| 6,026,125 A | * | 2/2000 | Larrick et al. | 375/295 |
| 6,298,246 B1 | * | 10/2001 | Lysejko et al. | 455/557 |
| 6,310,906 B1 | * | 10/2001 | Abarbanel et al. | 375/130 |
| 6,353,735 B1 | * | 3/2002 | Sorrells et al. | 455/118 |
| 6,434,194 B1 | * | 8/2002 | Eisenberg et al. | 375/238 |
| 6,445,737 B1 | * | 9/2002 | Walker | 375/239 |
| 6,456,221 B2 | * | 9/2002 | Low et al. | 341/157 |
| 6,480,318 B2 | * | 11/2002 | Mori et al. | 359/264 |
| 6,515,622 B1 | * | 2/2003 | Izadpanah et al. | 342/368 |
| 6,522,637 B1 | * | 2/2003 | Mimura et al. | 370/319 |
| 2001/0048382 A1 | | 12/2001 | Low et al. | |

FOREIGN PATENT DOCUMENTS

| WO | WO 0139451 A | 5/2001 | |
|---|---|---|---|
| WO | WO 200199305 A2 | * 12/2001 | H04B/7/00 |

* cited by examiner

Primary Examiner—Timothy P. Callahan
Assistant Examiner—Cassandra Cox

(57) ABSTRACT

A modulated ultra wideband pulse generation system is provided. The system comprises a pulse waveform generator circuit operable to generate an on-off pulse waveform, and a modulating circuit operable to receive a modulating signal and to modulate the on-off pulse waveform in response to the modulating signal. Further embodiments of the invention comprise a variable bandwidth circuit operable to alter the bandwidth of the pulses comprising the on-off pulse waveform. Various embodiments of the invention comprise on-off keying modulation, pulse position modulation, and pulse phase modulation.

12 Claims, 2 Drawing Sheets

ULTRA-WIDEBAND IMPULSE GENERATION AND MODULATION CIRCUIT

FIELD OF THE INVENTION

The invention relates generally to electronic radio circuitry, and more specifically to circuitry for generating and modulating ultra-wideband impulses.

BACKGROUND OF THE INVENTION

Ultra-wideband systems such as are used in radar, RF sensing, and communications systems typically rely on application of a short impulse signal to an antenna, which then radiates an ultra wideband signal. The characteristics of the radiated signal are largely based on the impulse response of the antenna, as the applied impulse is typically in the tens of picoseconds to nanosecond range. The propagated RF signal then typically has a fixed center frequency and fixed bandwidth, both of which can be in the multi-gigahertz range.

While such a system may be well suited for radar or other RF monitoring purposes, data communications applications require some method of modulating the signal or encoding information on the propagated RF signal. On-off keying (OOK), pulse position modulation, and other modulation techniques have been implemented to encode information into transmitted ultra wideband pulses, which can then be used to transmit information at a rate that is dependent on the ultra wideband system's pulse repetition frequency.

Technology such as avalanche transistors and zener diodes is commonly used to create such pulses, but even impulse excitations of several thousand watts typically result in less than one watt of peak microwave-band output power. Further, because the semiconductor devices tend to heat at such power levels, the pulse repetition rate is then limited to approximately 10 kHz or less. Much of the energy produced at frequencies lower than microwave is not propagated but is instead dissipated as heat, which can have a negative impact on circuit reliability.

Ultra wideband technology nevertheless remains desirable for some applications because it is difficult to detect or intercept, and such signals are difficult to jam. The impulse nature of ultra wideband transmission and the low power of the radiated signal virtually require exact synchronization between a receiver and transmitter, so that the receiver can accumulate enough pulses to provide a high probability of a detected signal. Ultra wideband radar or communications equipment also only minimally degrade the noise floor of other nearby RF equipment, making integration of ultra wideband systems into existing assemblies of various communication or radar equipment relatively nonintrusive.

But, these ultra wideband systems typically employ periodic or psuedorandomly timed pulses that are themselves uniform in configuration, making detection of pulses in radar applications straightforward. While such pulses work well for radar applications, they do not lend themselves well to other communication applications as they have not been adapted to carry information.

What is desired is an ultra wideband pulse generation system that can carry information, and that is low in cost and in power consumption.

SUMMARY OF THE INVENTION

The present invention provides a modulated ultra wideband pulse generation system. The system comprises a pulse waveform generator circuit operable to generate an on-off pulse waveform, and a modulating circuit operable to receive a modulating signal and to modulate the on-off pulse waveform in response to the modulating signal. Further embodiments of the invention comprise a variable bandwidth circuit operable to alter the bandwidth of the pulses comprising the on-off pulse waveform. Various embodiments of the invention comprise on-off keying modulation, pulse position modulation, and pulse phase modulation.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides a modulated ultra wideband pulse generation system. The system comprises a pulse waveform generator circuit operable to generate an on-off pulse waveform, and a modulating circuit operable to receive a modulating signal and to modulate the on-off pulse waveform in response to the modulating signal. The modulated on-off pulse waveform is therefore modified to contain information as is contained in the modulating signal, making the novel system operable to carry and transmit information. The pulse waveform is modulated in different embodiments of the invention by various modulation methods and circuits, including on-off keying modulation, pulse position modulation, and pulse phase modulation Further embodiments of the invention comprise a variable bandwidth circuit operable to alter the bandwidth of the pulses comprising the on-off pulse waveform. Such a circuit will in some embodiments of the invention take the form of a low-pass filter, wherein the filter serves to reduce the high-frequency content of the pulses and therefore reduces their spectral bandwidth.

Figure 1:
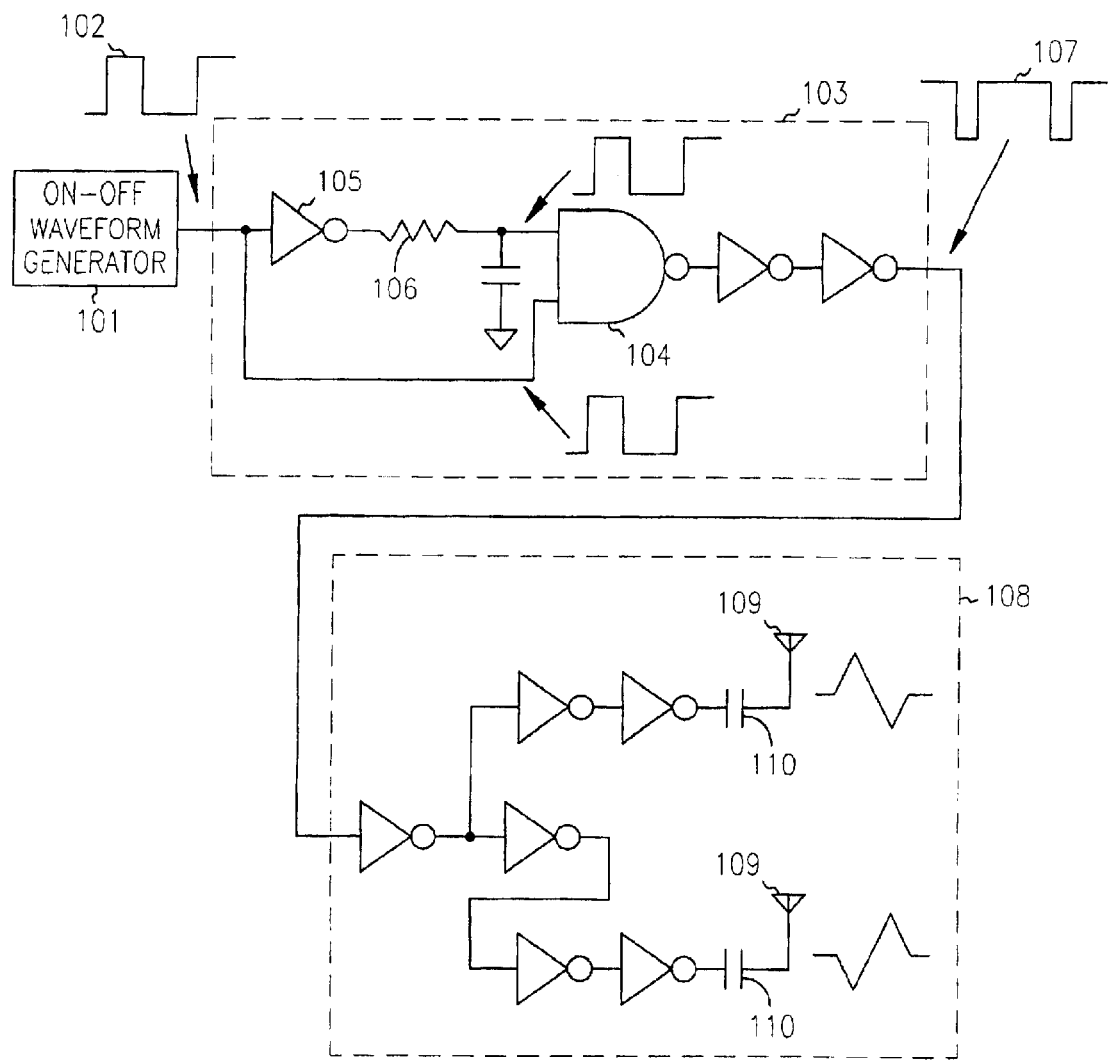
FIG. 1 shows a schematic diagram of an ultra wideband pulse generation system consistent with the present invention.

FIG. 1 illustrates an ultra-wideband pulse generation system consistent with the present invention. At 101, an on-off waveform is generated. The waveform when appeared as a varying voltage appears approximately as is shown at 102. An impulse generator circuit is shown at 103, and produces a short pulse on an off-to-on transition of the on-off waveform generator 101. This is accomplished by feeding the output 102 of the on-off waveform generator into a NAND gate, along with an inverted and delayed representation of the same output signal 102. The inversion is performed by inverter 105, and the delay is introduced by low-pass RC filter 106. In one embodiment of such a circuit, a typical inverter delay time of 80 picoseconds plus an RC filter-imposed delay of approximately a nanosecond yields a total signal delay of slightly more than one nanosecond. The period of the delay between the delayed inverted signal and the original signal is controlled by the filter characteristics of the RC filter 106, and determines the time period of the output pulses shown at 107.

The generated pulses as shown at 107 are then fed to a power amplifier circuit section as is shown at 108. The power amplifier section as pictured here is represented by a series of inverters having high power capability, which feed one or more capacitively coupled antennas 109. The capacitors 110 function as a low-pass filter and effectively differentiate the incoming signal, providing an output waveform resembling a sine wave or bandwidth-limited triangular wave to the antenna.

While a circuit such as is shown in FIG. 1 is useful for applications such as ultra-wideband radar, it is not capable of encoding information into the transmitted ultra-wideband pulse. The circuit of FIG. 2 incorporates a variety of encoding or modulation circuits as may be used in various embodiments of the present invention to modulate the ultra-wideband pulse waveform with information.

At 201, an on-off waveform generator again produces a pulse train as was seen at 102 in FIG. 1. At 202, the pulse train passes through an OOK, or on-off keying modulation circuit. The signal is inverted at 203, and is modulated by transistor 204, which is turned on and off by modulating signal 207. The modulated signal is connected to pull-up resistor 205, and is inverted at inverter 206 which provides a modulated output signal.

At 208, a pulse position modulating circuit comprises an input inverter 209 and a series resistor 210. A capacitor 211 and a transistor 212 link the resistor output to ground, and a modulating signal 213 switches the capacitor-to-ground connection on and off according to the modulating signal 213. When the capacitor is switched into the circuit, the resistor 210 and the capacitor 211 form and RC low-pass filter, and delay propagation of the pulse waveform. The waveform is then passed through inverter 214, which provides an output from the pulse position modulating circuit. The delay imposed by the pulse position modulating circuit is dependent on the values of the resistor 210 and capacitor 211, and can be adjusted by varying the values of these components to provide varying delay in various embodiments of this circuit.

At 215, the square wave pulse is fed to a pulse duration and bandwidth control circuit 215. Much like the impulse generator circuit 103 of FIG. 1, the incoming signal is received by a inverter 216, delayed by an RC filter comprising resistor 217 and capacitor 218, and fed to a NAND gate 219. The output from the NAND gate 219 is then fed through two series inverters 220 and 221, which provide an output. However, the circuit here includes a capacitor 222 and a transistor 223 which switches the capacitor into the circuit between the delayed NAND gate input and ground, effectively altering the RC filter circuit and increasing the time delay of the delayed pulse. The transistor switches the capacitor into and out of the circuit according to the state of the modulating signal 224, such that when the modulating signal is high, the RC circuit formed by resistor 217 and capacitors 218 and 222 has a significantly greater time constant than the RC circuit formed by resistor 217 and capacitor 218 alone. This increase in the RC time constant results in a correspondingly lengthened pulse duration on the output of the NAND gate when a low-to-high transition of the incoming signal arriving at the input of inverter 216 and an input of NAND gate 219. Therefore, the modulating signal 224 is operable in this example pulse duration modulation circuit to vary the duration of the ultra-wideband pulses output from inverter 221.

At 225, a pulse phase modulator circuit receives the incoming pulse waveform and a modulating signal 226 in an exclusive-or (XOR) gate 227. When only one of the two signals is high, the output of the XOR gate is high, and is inverted by inverter 228 which provides the pulse phase modulation circuit output. The modulating signal 226 therefore determines whether the output from the pulse phase modulation circuit is by default low and changes state high during a received pulse, or is by default high and changes state low during a received pulse.

The pulse waveform is fed into a series of inverters 229, which serve to both invert the received waveform and amplify it. The inverters here are capable of providing the desired output to one or more connected antennas 231, via differentiating capacitors 230. As with the circuit of FIG. 1, the capacitors 230 serve to differentiate the received pulse waveform and produce a bandwidth limited triangular waveform somewhat resembling a sinusoidal impulse.

Figure 2:
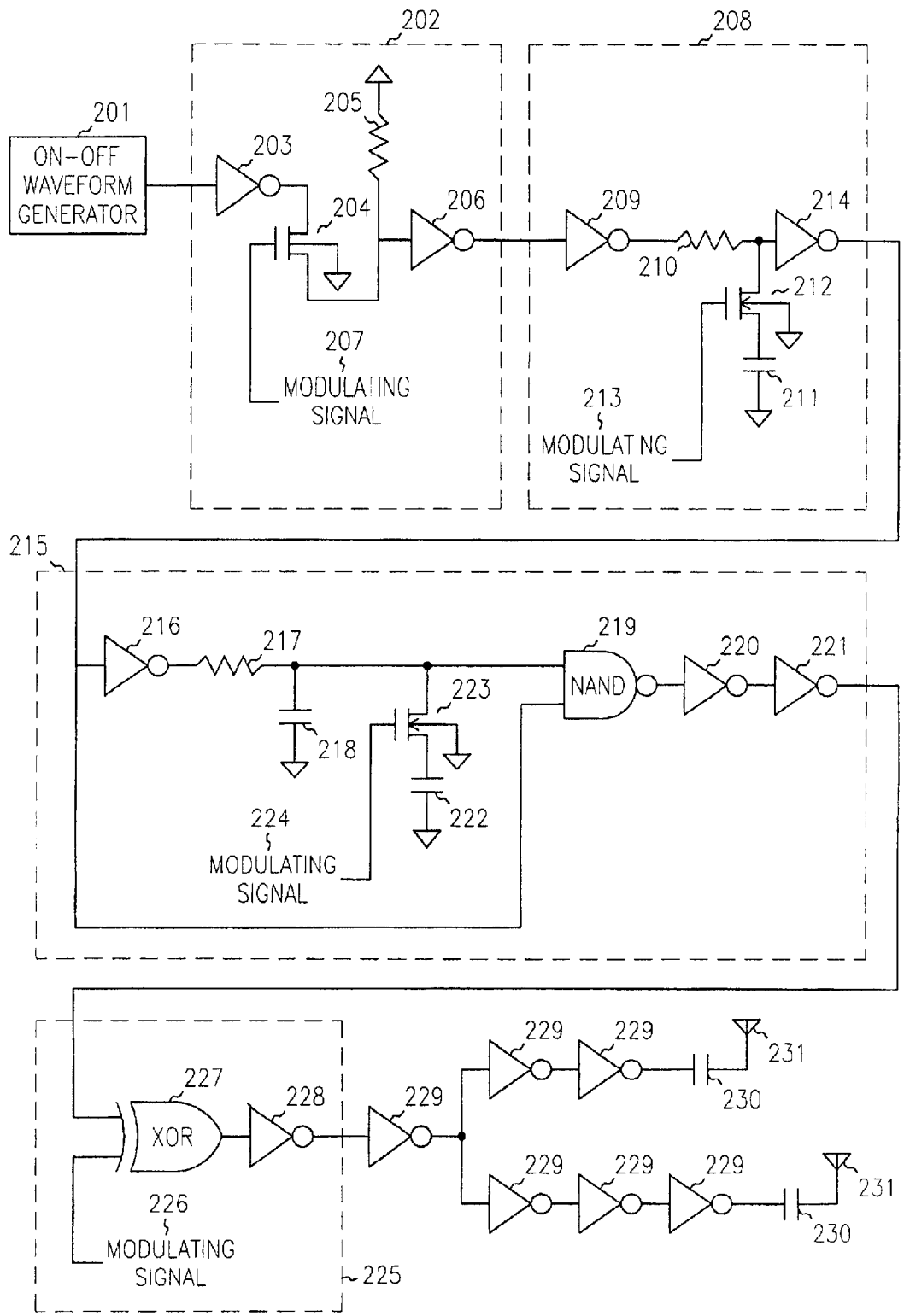
FIG. 2 shows a schematic diagram of a modulated ultra wideband pulse generation system, consistent with an embodiment of the present invention.

While the circuit of FIG. 2 includes a variety of modulation circuits, it is anticipated that other embodiments of the invention will often include fewer or a single modulation circuit to implement a single modulation method. It is, however, both possible and desirable in some embodiments of the invention to use multiple modulation methods to enable encoding of more data or more robust encoding of data into the transmitted ultra-wideband pulse stream. It is further anticipated that the present invention will be implemented using various configurations of bandwidth and frequency.

One example system consistent with the examples presented here comprises pulses of approximately one nanosecond in duration, such that the very short pulse duration results in a very wide bandwidth transmitted by the antenna. A typical resulting bandwidth might be one gigahertz, with a center frequency of one gigaHertz and a transmitted power of tens of milliWatts. This ultra wide bandwidth provides good security and immunity to interception or jamming, particularly in applications where significant parts of the spectrum are blocked or used for other purposes. Further, if part of the spectrum is blocked by the propagation medium, such as in underground detection or communication, the ultra-wideband system provides an efficient method of ensuring penetration in unblocked frequencies. The short pulse width of a system such as is described here further enables accurate ranging, making the system particularly useful for applications such as detection and ranging of underground objects.

The ultra-wideband system described herein is also relatively secure when utilized for communication, as receiving and evaluating many such signals requires advanced techniques such as detection and integration of several pulses, synchronization of the transmitter and receiver, or time-gating to sufficiently distinguish a low-power signal from the noise floor.

Also, various components of the circuits as shown in FIGS. 1 and 2 may be substituted for other components that are capable of implementing the invention as claimed in the appended claims. For example, the inverters 229 may be easily replaced with op-amps configured as comparators, with comparators, or with a variety of other components that will perform a similar function. The antennas 231 are in some embodiments of the invention a loop antenna, and in other embodiments take the form of other types of wide bandwidth antennas. Also, some embodiments of the invention incorporate variable RC time constants, which may be implemented via a number of functionally equivalent circuits or mechanisms. It will be evident to one skilled in the art that a variety of other such circuit modifications may be made consistent with the invention as described herein and as recited in the attached claims.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A modulated ultra wideband pulse generation system, comprising:

a pulse waveform generator circuit operable to generate an on-off pulse waveform;

a modulating circuit, operable to receive a modulating signal and to modulate the on-off pulse waveform in response to the modulating signal to produce an ultra-wideband radio frequency pulse;

an antenna; and a capacitor placed between the antenna and the modulating circuit.

2. A modulated ultra wideband pulse generation system, comprising:

a pulse waveform generator circuit operable to generate an on-off pulse waveform;

a modulating circuit, operable to receive a modulating signal and to modulate the on-off pulse waveform in response to the modulating signal to produce an ultra-wideband radio frequency pulse, wherein the pulse waveform generator circuit generates a pseudorandom waveform.

3. A modulated ultra wideband pulse generation system, comprising:

a pulse waveform generator circuit operable to generate an on-off pulse waveform;

a modulating circuit, operable to receive a modulating signal and to modulate the on-off pulse waveform in response to the modulating signal to produce an ultra-wideband radio frequency pulse; and a variable bandwidth circuit operable to change the bandwidth of the ultra wideband pulse.

4. The modulated ultra wideband pulse generation system of claim 3, wherein the variable bandwidth circuit comprises a lowpass filter.

5. The modulated ultra wideband pulse generation system of claim 4, wherein the lowpass filter comprises a resistor—capacitor circuit wherein at least one of the resistor and capacitor are variable.

6. A modulated ultra wideband pulse generation system, comprising:

a pulse waveform generator circuit operable to generate an on-off pulse waveform;

a modulating circuit, operable to receive a modulating signal and to modulate the on-off pulse waveform in response to the modulating signal to produce an ultra-wideband radio frequency pulse; wherein the modulating circuit comprises a pulse position modulator operable to selectively delay the on-off pulse waveform in response to a modulating signal, the pulse position modulator comprising a resistor—capacitor lowpass filter having a time constant that is varied in response to the modulating signal, operable to selectively delay the pulse position in response to the modulating signal.

7. A modulated ultra wideband pulse generation system, comprising:

a pulse waveform generator circuit operable to generate an on-off pulse waveform;

a modulating circuit, operable to receive a modulating signal and to modulate the on-off pulse waveform in response to the modulating signal to produce an ultra-wideband radio frequency pulse; wherein the modulating circuit comprises a phase modulator operable to selectively change the phase of the waveform in response to a modulating signal, wherein the phase modulator comprises an exclusive or (XOR) gate having the on-off pulse waveform as one input, a modulating signal as a second input, and a modulated signal as an output.

8. A method of producing a modulated ultra wideband pulse, comprising:

generating an on-off pulse waveform; modulating the on-off pulse waveform in response to a received modulating signal to produce a modulated ultrawideband radio frequency pulse; and, wherein the generated on off pulse waveform comprises a random or pseudorandom stream of on-off pulses.

9. A method of producing a modulated ultra wideband pulse, comprising:

generating an on-off pulse waveform; modulating the on-off pulse waveform in response to a received modulating signal to produce a modulated ultrawideband radio frequency pulse; and changing the bandwidth of the on-off pulse waveform via a variable bandwidth circuit.

10. The method of claim 9, wherein the variable bandwidth circuit comprises a resistor—capacitor lowpass circuit wherein at least one of the resistor and capacitor are variable.

11. A method of producing a modulated ultra wideband pulse, comprising:

generating an on-off pulse waveform; and modulating the on-off pulse waveform in response to a received modulating signal to produce a modulated ultrawideband radio frequency pulse, wherein modulating the on-off pulse waveform comprises modulating the pulse position such that the pulse position is selectively delayed in response to a modulating signal, and wherein the pulse position is modulated via a resistor—capacitor lowpass filter having a time constant that is varied in response to the modulating signal, operable to selectively delay the pulse position in response to the modulating signal.

12. A method of producing a modulated ultra wideband pulse, comprising:

generating an on-off pulse waveform; and modulating the on-off pulse waveform in response to a received modulating signal to produce a modulated ultrawideband radio frequency pulse, wherein modulating the on-off waveform comprises phase modulation of the waveform such that the phase of the waveform is selectively changed in response to a modulating signal wherein the phase modulation is performed via a circuit comprising an exclusive or (XOR) gate having the on-off pulse waveform as one input, a modulating signal as a second input, and a modulated signal as an output.

* * * * *